(12) United States Patent
Rother

(10) Patent No.: US 6,417,564 B2
(45) Date of Patent: Jul. 9, 2002

(54) SEMICONDUCTOR ELEMENT WITH METAL LAYER

(75) Inventor: Michael Rother, Uetersen (DE)

(73) Assignee: Koninklijke Philips Electronics N.V., New York, NY (US)

(*) Notice: Subject to any disclaimer, the term of this patent is extended or adjusted under 35 U.S.C. 154(b) by 0 days.

(21) Appl. No.: 09/769,179

(22) Filed: Jan. 25, 2001

(30) Foreign Application Priority Data

Jan. 27, 2000 (DE) .......................................... 100 03 539

(51) Int. Cl.$^7$ ............................................... H01L 23/48
(52) U.S. Cl. ........................................ 257/740; 257/763
(58) Field of Search ................................ 257/763, 769, 257/766; 438/652; 437/194

(56) References Cited

U.S. PATENT DOCUMENTS 5,312,776 A * 5/1994 Murakami et al. .......... 437/194
5,731,635 A * 3/1998 Barcither et al. ........... 257/763
6,140,703 A * 10/2000 Cronin et al. ............... 257/766
6,248,664 B1 * 6/2001 Saha et al. .................. 438/652

FOREIGN PATENT DOCUMENTS

EP          0756325 A2    1/1997

* cited by examiner

Primary Examiner—David Nelms
Assistant Examiner—Thinh Nguyen
(74) Attorney, Agent, or Firm—Steven R. Biren

(57) ABSTRACT

The invention relates to a semiconductor element which comprises a metal layer with gold and germanium. A thin covering layer of germanium oxide lies on the metal layer, protecting the subjacent metal layer from undesirable oxidation of the germanium. The invention also relates to a method of manufacturing such a semiconductor element.

5 Claims, No Drawings

SEMICONDUCTOR ELEMENT WITH METAL LAYER

The invention relates to a semiconductor element which comprises a metal layer of a binary or ternary gold-germanium alloy, and to a method of manufacturing such a semiconductor component.

Semiconductor components are manufactured in that first discrete semiconductor elements such as, for example, transistors and systems of transistors with other elements such as, for example, digital transistors, diodes, sensors, resistors, or small capacitors, are manufactured. Several thousands of such discrete elements are simultaneously manufactured for this purpose on a silicon wafer.

The silicon wafer is then cut up into individual transistor systems (chips). Each of these system is fastened to a carrier, is provided with electrical supply lines, and is incorporated into a housing. The incorporated transistors, diodes, etc. are then soldered into circuits or other assemblies together with their housings.

Various methods are known for fastening a semiconductor element on a carrier or a chip fastening part.

EP 0 756 325 A2 discloses a semiconductor device which comprises a carrier, a semiconductor element provided on this carrier, and a metal layer comprising gold and germanium which is arranged between the semiconductor element and the carrier, while several metal layers have been deposited on a surface of the semiconductor element, and the metal layer comprising gold and germanium is provided on the upper metal layer. Mounting of the semiconductor element on the carrier takes place by soldering.

The eutectic mixing ratio of gold and germanium is used in the upper metal layer so as to be able to enjoy the advantage of a low soldering temperature. However, a narrow-band tolerance range of the mixing ratio is a condition for achieving an optimum soldering temperature. Germanium shows a tendency to migrate to the layer surface. The germanium is oxidized in an uncontrolled manner there, which changes the mixing ratio of gold and germanium.

It is an object of the present invention to provide a semiconductor element which comprises a metal layer with gold and germanium which exhibits an improved long-term stability in its composition.

According to the invention, this object is achieved with a semiconductor element which comprises a metal layer of a binary or ternary gold-germanium alloy, and which has a covering layer of germanium oxide on said metal layer.

The covering layer of germanium oxide seals the metal layer comprising germanium and gold and thus prevents a further, uncontrolled growth of germanium oxide. When the semiconductor element is soldered onto a carrier, the mixing ratio of gold and germanium will still lie within the desired range.

The invention also relates to a method of manufacturing a semiconductor element, in which method p-type and n-type conductivity regions are made on a semiconductor substrate, a metal layer comprising a binary or ternary gold-germanium alloy is provided on the rear side of said semiconductor substrate, the metal layer is exposed to an atmosphere of hexamethyl disilazane, and the semiconductor element is subsequently stored in an atmosphere containing oxygen.

After the semiconductor element has been manufactured and the metal layer of gold and germanium has been provided, said metal layer is exposed to an atmosphere of hexamethyl disilazane. A thin layer of crystallization nuclei is formed on the surface of the metal layer of germanium and gold during this process. Storage in an atmosphere with oxygen then leads to the formation of a covering layer of germanium oxide.

The formation of germanium oxide is self-limiting, similar to the formation of $Al_2O_3$ on Al layers.

The invention will be explained in more detail below with reference to two embodiments.

A semiconductor element may be a discrete bipolar transistor, in particular a planar transistor or a field effect transistor, or alternatively a semiconductor diode, in particular a planar diode or a Schottky diode, and furthermore a sensor element or a combination of a transistor with other electronic elements, for example a digital transistor.

These or other semiconductor elements are soldered on a carrier or a chip fastening part by means of a metal layer, said fastening part carrying a further metal layer, and are subsequently incorporated in a housing. After they have been provided with electrical connectors, they can be used for assembling printed circuit boards and the like.

The semiconductor elements are manufactured mainly from silicon. In the case of discrete elements, these are usually thin, doped silicon plates with a layer thickness of 0.05 to 0.6 mm and a diameter of 0.02 to 20 $mm^2$.

A metal layer of a binary or ternary gold-germanium alloy, with a preferred germanium content of 4 to 20% by weight, is provided on the lower (rear) side of the semiconductor element. Ternary gold-germanium alloys with, for example, boron or antimony as a third alloy ingredient may be used.

Alternatively, further metal layers may be provided between the semiconductor element and the metal layer comprising gold and germanium.

Subsequently, the metal layer is exposed to an atmosphere of hexamethyl disilazane (HMDS). This may be realized in that, for example, gaseous HMDS is conducted over the metal layer comprising gold and germanium together with a carrier gas such as, for example, $N_2$. The HMDS deposits in the form of numerous small crystallization nuclei on the surface of the metal layer. These numerous crystallization points subsequently lead to a controlled, self-limiting oxidation of the germanium at the surface of the metal layer upon a subsequent storage in an atmosphere containing oxygen, and a thin, monomolecular covering layer of germanium oxide is formed. After the closed germanium oxide layer has been formed, a further oxidation of the germanium will not take place, and the gold/germanium mixing ratio will remain intact.

Mounting on the carrier usually takes place by soldering, in particular by brazing. For this purpose, the carrier must also be provided with a metal layer capable of soldering/brazing. This soldering/brazing layer may consist, for example, of silver, gold, or an Sn/Pb alloy.

Two embodiments of the invention are explained in more detail below, representing examples of how the invention may be realized in practice.

EMBODIMENT 1

To manufacture NPN transistors, the p-type and n-type conductivity regions were generated on the front side of an n-type doped silicon substrate wafer in a known manner. Then a metal layer of gold and germanium with a germanium content of 12% by weight and a thickness of 1.3 $\mu m$ was deposited on the rear side of the silicon substrate wafer.

Gaseous HMDS together with $N_2$ as a carrier gas was subsequently conducted over the surface of the metal layer of gold and germanium. A thin covering layer of $GeO_2$ was formed on the metal layer upon storage in an atmosphere with oxygen.

The silicon substrate wafer thus metallized was split up into single chips with a diamond saw. The chips were soldered onto a carrier having a silver layer.

Semiconductor elements were manufactured in this manner, each comprising a discrete NPN transistor chip.

EMBODIMENT 2

To manufacture PNP transistors, the p-type and n-type conductivity regions were generated on the front side of a p-type doped silicon substrate wafer in a known manner. Then a metal layer of gold and germanium with a germanium content of 12% by weight and a thickness of 1.3 µm was deposited on the rear side of the silicon substrate wafer.

Gaseous HMDS with $N_2$ as a carrier gas was subsequently passed over the surface of the metal layer of gold and germanium. A thin covering layer of $GeO_2$ was formed on the metal layer upon storage in an atmosphere with oxygen.

The silicon substrate wafer thus metallized was separated into individual chips by means of a diamond saw. The chips were soldered onto a carrier having a silver layer.

Semiconductor elements were manufactured in this manner which each comprised a discrete PNP transistor chip.

What is claimed is:

1. A semiconductor element comprising:
   a metal layer of a binary or ternary gold-germanium alloy of defined gold/germanium mixing ratio; and
   a covering layer of germanium oxide on said metal layer.

2. A method of manufacturing a semiconductor element, comprising:
   providing p-type and n-type conductivity regions on a substrate;
   providing a metal layer comprising a binary or ternary gold-germanium alloy on the rear side of the substrate;
   exposing the metal layer to an atmosphere of hexamethyl disilazane; and
   storing the semiconductor element in an atmosphere containing oxygen.

3. A method of manufacturing a semiconductor element, comprising:
   providing p-type and n-type conductivity regions on a substrate;
   providing a metal layer comprising a binary or ternary gold-germanium alloy with a defined gold/germanium mixing ratio on the rear side of the substrate; and
   fixing the gold/germanium mixing ratio in the gold-germanium alloy.

4. The method of claim 3, where said defined gold/germanium mixing ratio is fixed by providing an additional layer on the rear of the metal layer that precludes oxidation of germanium.

5. The method of claim 4, where said oxidation of germanium is precluded by:
   exposing the metal layer to an atmosphere of hexamethyl disilazane; and
   storing the semiconductor element in an atmosphere containing oxygen.

* * * * *